United States Patent
Hu et al.

(10) Patent No.: US 8,431,473 B2
(45) Date of Patent: Apr. 30, 2013

(54) METHOD FOR FABRICATING SEMICONDUCTOR DEVICE

(75) Inventors: Shu-Hui Hu, Tainan (TW); Shih-Feng Su, Kao-Hsiung (TW); Hui-Shen Shih, Changhua County (TW); Chih-Chien Liu, Taipei (TW); Po-Chun Chen, Tainan (TW); Ya-Jyuan Hung, Kaohsiung (TW); Bin-Siang Tsai, Changhua County (TW); Chin-Fu Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/177,573

(22) Filed: Jul. 7, 2011

(65) Prior Publication Data

US 2013/0009288 A1    Jan. 10, 2013

(51) Int. Cl.
*H00L 21/28* (2006.01)
(52) U.S. Cl.
USPC .................................. 438/597; 257/E21.158

(58) Field of Classification Search .................. 257/649; 438/597
See application file for complete search history.

(56) References Cited

U.S. PATENT DOCUMENTS

| | | | |
|---|---|---|---|
| 6,888,225 B2 * | 5/2005 | De Santi et al. | 257/639 |
| 7,217,658 B1 | 5/2007 | Bayman | |
| 7,335,611 B2 | 2/2008 | Ramaswamy | |
| 2008/0096303 A1 * | 4/2008 | Wang | 438/70 |
| 2008/0185724 A1 * | 8/2008 | Tseng et al. | 257/762 |
| 2010/0264473 A1 * | 10/2010 | Adkisson et al. | 257/292 |

OTHER PUBLICATIONS

Tai-Kyung Kim, "Profile simulation and stress analysis for optimization of an intermetal dielectric deposition (IMD) process", 1999 IEEE.

* cited by examiner

*Primary Examiner* — Thao P. Le
(74) *Attorney, Agent, or Firm* — Winston Hsu; Scott Margo

(57) ABSTRACT

A method for fabricating a semiconductor device is disclosed. The method includes the steps of: providing a substrate; forming a dielectric layer on the substrate, wherein the dielectric layer comprises metal interconnects therein; forming a top metal layer on the dielectric layer; and forming a passivation layer on the top metal layer through high-density plasma chemical vapor deposition (HDPCVD) process.

20 Claims, 3 Drawing Sheets

|  | Top | Side | Bias | Stress |
|---|---|---|---|---|
| HDP7K | 1500 W | 6000 W | 6500 W | $-6.19E+08$ dyne/cm$^2$ |
| HDP7KT1 | 1500 W | 6000 W | 3000 W | $-8.46E+08$ dyne/cm$^2$ |
| HDP7KT2 | 1500 W | 6000 W | 0 W | $-4.42E+09$ dyne/cm$^2$ |

FIG. 3

METHOD FOR FABRICATING SEMICONDUCTOR DEVICE

BACKGROUND OF THE INVENTION

1. Field of the Invention

The invention relates to a method for fabricating semiconductor device, and more particularly, to a method of using HDPCVD process for forming passivation layer on a substrate.

2. Description of the Prior Art

Semiconductor integrated circuits manufactured with Large Scale of Integration (LSI) technologies (LSI, VLSI, ULSI) require a protective layer against mechanical stress and aggressive chemical agents. This layer, generally called "passivation layer" is typically formed by silicon-based dielectrics, such as silicon dioxide (USG), phosphorus-doped or fluorurate-doped silicon oxide (PSG or FSG), silicon nitrides and nitride oxides ($Si_3N_4$, $SiO_xN$).

The passivation layer is conventionally formed by means of Chemical Vapor Deposition (CVD) techniques, either Plasma-Enhanced (PECVD) or at Atmospheric Pressure (APCVD).

Final passivation layers formed by means of the above-referred conventional techniques however have some drawbacks. For instance, a temperature mismatch typically results from a flip-chip bonding process and as stress is released from high temperature, phenomenon such as die warpage would result and cause issue such as bump crack. As current technique for fabricating such passivation layer has proven to be unsatisfactory, it is an important task to search for a novel method for resolving the above issue.

SUMMARY OF THE INVENTION

It is an objective of the present invention to provide a method for fabricating a semiconductor device with a compressive oxide layer depositing on the top metal layer for resolving the aforementioned issues.

According to a preferred embodiment of the present invention, a method for fabricating a semiconductor device is disclosed. The method includes the steps of: providing a substrate; forming a dielectric layer on the substrate, wherein the dielectric layer comprises metal interconnects therein; forming a top metal layer on the dielectric layer; and forming a passivation layer on the top metal layer through high-density plasma chemical vapor deposition (HDPCVD) process.

It is another aspect of the present invention to provide a method for fabricating a semiconductor device. The method includes the steps of: providing a substrate; forming a dielectric layer on the substrate, wherein the dielectric layer comprises metal interconnects therein; forming a top metal layer on the dielectric layer; forming a first stress-relief layer on the top metal layer; forming a pad on the first stress-relief layer; and forming a second stress-relief layer on the pad and the first stress-relief layer, wherein the second stress-relief layer comprises a high compressive silicon nitride layer.

It is another aspect of the present invention to provide a semiconductor device, which includes: a substrate; a dielectric layer disposed on the substrate, wherein the dielectric layer comprises metal interconnects therein; a top metal layer disposed on the dielectric layer; a first stress-relief layer disposed on the top metal layer; a pad disposed on the first stress-relief layer; and a second stress-relief layer disposed on the first stress-relief layer and the pad, wherein the second stress-relief layer comprises a high compressive silicon nitride layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a table of applying different bias RF to form an oxide layer on a substrate.

DETAILED DESCRIPTION

Figure 1:
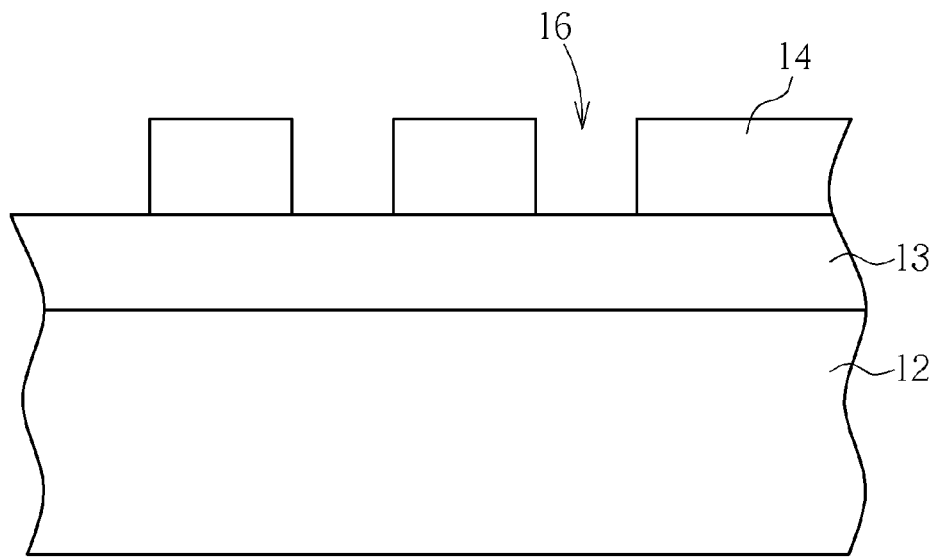
FIGS. 1-2 illustrate a method for fabricating a semiconductor device according to a preferred embodiment of the present invention.
Figure 2:
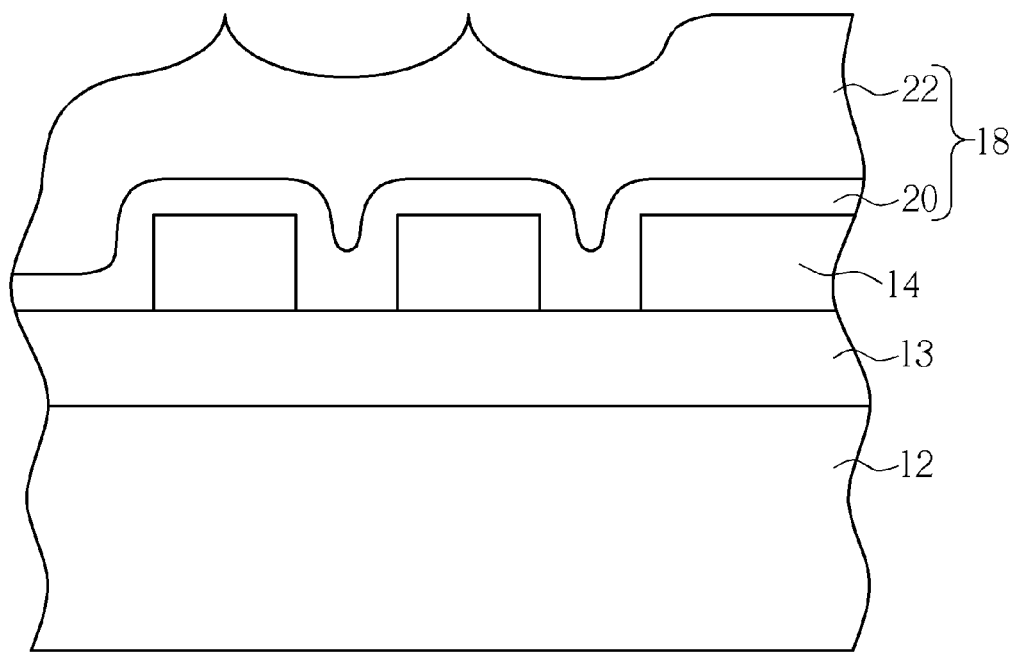

Referring to FIGS. 1-2, FIGS. 1-2 illustrate a method for fabricating a semiconductor device according to a preferred embodiment of the present invention. As shown in FIG. 1, a substrate 12, such as a silicon substrate or a silicon-on-insulator (SOI) substrate is provided. At least an active device or passive device could be formed on the substrate 12, in which the active device could be a metal-oxide semiconductor (MOS) transistor and the passive device could be a capacitor.

A dielectric layer, such as an interlayer dielectric layer 13 could be deposited to cover the aforementioned active or passive device, and a plurality of contact plugs are formed in the interlayer dielectric layer for connecting the active or passive devices to the metal interconnects above. After the contact plugs are formed, multiple layers of inter-metal dielectrics and metal interconnects connecting the contact plugs are formed on top of the interlayer dielectric layer 13.

It should be noted that in order to emphasize the process of the present invention, the active or passive devices, the inter-metal dielectrics, and metal interconnects are omitted herein for sake of brevity. Hence, as shown in FIG. 1, only the top metal layer 14, such as the most top portion of the metal interconnects is revealed on top of the substrate 12. A series pattern transfer and etching process could be performed on the top metal layer 14 and as the top metal layer 14 is patterned, a plurality of gaps 16 are formed between the patterned portions of the top metal layer 14.

As shown in FIG. 2, after forming the top metal layer 14 on the substrate 12, a passivation layer 18 is formed on the substrate 12 to cover the top metal layer 14 and the interlayer dielectric layer 13. The passivation layer 18 could include multiple dielectric layers, such as a nitride layer 20, an oxide layer (USG) 22, a PSG layer (not shown), and another nitride layer (not shown) on the PSG layer. Despite only four layers of dielectric material are formed on the top metal layer 12, it should be noted that the quantity of these layers is not limited to four, but could be adjusted according to the demand of the product.

According to a preferred embodiment of the present invention, the nitride layer 20, preferably serving as a stop layer, is first deposited to cover the surface of one of the inter-metal dielectrics (not shown) underneath and the top metal layer 14, and the oxide layer 22, such as an undoped silicon glass is then deposited on top of the nitride layer 20 through a high-density plasma chemical vapor deposition (HDPCVD) process. In this embodiment, the deposition of the oxide layer 22 is preferably achieved by decreasing the bias RF of an apparatus used for carrying out the HDPCVD process. As the oxide layer 22 deposited in this manner could be used to relief stress of the device, the oxide layer 22 is also referred to as a first stress-relief layer.

Referring to FIG. 3, FIG. 3 illustrates a table of applying different bias RF to form an oxide layer on a substrate. As shown in FIG. 3, three experiments were conducted to each deposit an oxide layer on a substrate through HDPCVD process, in which each oxide layer is formed with a set of bias RF. Preferably, the bias RF with respect to top of the reaction chamber (labeled top) and side of the chamber (labeled side) were maintained the same for each oxide layer. The bias RF with respect to the bottom of the reaction chamber (labeled Bias) however has been decreased from the baseline oxide layer (labeled HDP7K) to the two experimental oxide layers (labeled HDP7KT1 and HDP7KT2).

As a result, the baseline oxide layer (labeled HDP7K) is deposited with a bias RF of 6500 W on an aforementioned top metal layer, the first experimental oxide layer (labeled HDP7KT1) is deposited with a bias RF of 3000 W and a second experimental oxide layer (labeled HDP7KT2) is deposited with a bias RF of 0 W. Preferably, the bias RF of the apparatus is gradually decreased from the baseline oxide layer to two other experimental layers to test for the stress state of each layer.

As observed in the last column of the table, the baseline oxide layer (labeled HDP7K) has obtained a stress value of $-6.19E+08$ dyne/cm$^2$, whereas the first experimental oxide layer (labeled HDP7KT1) received a stress value of $-8.46E+08$ dyne/cm$^2$ and the second experimental oxide layer (labeled HDP7KT2) received a stress value of $-4.42E+09$ dyne/cm$^2$.

As a more negative value typically indicates a state of compressive strain, the result obtained from FIG. 3 reveals that the states of the first experimental oxide layer and the second experimental layer that have been treated with lowered bias RF have a substantially more compressive strain compare with the baseline oxide layer treated with higher bias RF.

Figure 4:
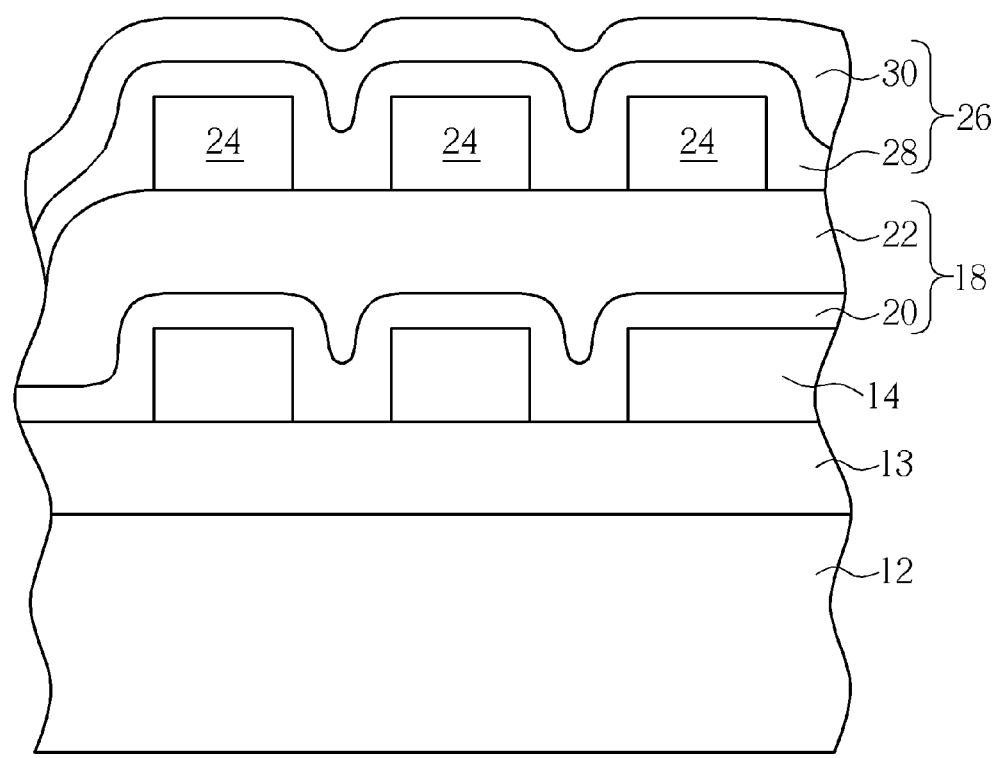
FIG. 4 illustrates a method for fabricating a semiconductor device according to an embodiment of the present invention.

Referring to FIG. 4, which illustrates a method for fabricating a semiconductor device according to another embodiment of the present invention. As shown in FIG. 4, after the structure revealed in FIG. 2 is obtained, a plurality of pads 24 could be formed on top of the passivation layer 18, such as on the surface of the first stress-relief layer 22. In an embodiment of the present invention, the thickness of the first stress-relief layer 22 is between 6500 and 7500 A (Angstrom), preferably 7000 A. The pads 24 are preferably composed of aluminum, but not limited thereto. After the pads 24 are formed, another passivation layer 26 is deposited to cover both the pads 24 and the first stress-relief layer 22. The passivation layer 26 could include multiple dielectric layers, such as a PSG layer 28 and a second stress-relief layer 30 on top of the PSG layer 28, in which the second stress-relief layer 30 is preferably a high compressive silicon nitride layer. In this embodiment, the stress range of the second stress-relief layer 30 is between $-1E+08$ dyne/cm$^2$ and $-2E+10$ dyne/cm$^2$ and the thickness of the second stress-relief layer 30 is between 500 to 10000 A, preferably 6000 A. It should be noted that even though a semiconductor device having both a first stress-relief layer 22 fabricated through HDPCVD process and a second stress-relief layer 30 composed of high compressive SiN layer is disclosed in this embodiment, the present invention could also provide a device with only a single first stress-relief layer 22 fabricated through HDPCVD process or only a single second stress-relief layer 30 composed of high compressive SiN layer, which are all within the scope of the present invention.

Overall, by forming an oxide layer with substantially compressive state onto the top metal layer through lowering the bias RF of the apparatus used for performing the HDPCVD process and/or depositing a high compressive silicon nitride layer on top of the aforementioned HDPCVD oxide layer and the pads, the semiconductor device of the present invention could prevent issues such as die warpage and bump crack caused during bonding process.

Those skilled in the art will readily observe that numerous modifications and alterations of the device and method may be made while retaining the teachings of the invention.

What is claimed is:

1. A method for fabricating a semiconductor device, comprising:
    providing a substrate;
    forming a dielectric layer on the substrate, wherein the dielectric layer comprises metal interconnects therein;
    forming a top metal layer on the dielectric layer; and
    forming a passivation layer on the top metal layer through high-density plasma chemical vapor deposition (HDPCVD) process; and
    forming a conductive pad on the passivation layer.

2. The method of claim 1, wherein the step of forming the passivation layer comprises:
    forming a nitride layer on the dielectric layer to cover the top metal layer; and
    performing the HDPCVD process for forming an oxide layer on the nitride layer.

3. The method of claim 2, wherein the oxide layer comprises an undoped silicon glass.

4. The method of claim 1, further comprising decreasing bias RF of an apparatus for performing the HDPCVD process.

5. The method of claim 4, wherein the bias RF is between 0-6500 W.

6. The method of claim 1, wherein the top metal layer comprises a patterned metal layer.

7. A method for fabricating a semiconductor device, comprising:
    providing a substrate;
    forming a dielectric layer on the substrate, wherein the dielectric layer comprises metal interconnects therein;
    forming a top metal layer on the dielectric layer;
    forming a first stress-relief layer on the top metal layer;
    forming a conductive pad on the first stress-relief layer; and
    forming a second stress-relief layer on the conductive pad and the first stress-relief layer, wherein the second stress-relief layer comprises a high compressive silicon nitride layer.

8. The method of claim 7, further comprising performing a high-density plasma chemical vapor deposition (HDPCVD) process for forming the first stress-relief layer.

9. The method of claim 7, wherein the step of forming the first stress-relief layer comprises:
    forming a nitride layer on the dielectric layer to cover the top metal layer; and
    performing a HDPCVD process for forming an oxide layer on the nitride layer.

10. The method of claim 9, wherein the oxide layer comprises an undoped silicon glass.

11. The method of claim 8, further comprising decreasing bias RF of an apparatus for performing the HDPCVD process.

12. The method of claim 11, wherein the bias RF is between 0-6500 W.

13. The method of claim 7, wherein the top metal layer comprises a patterned metal layer.

14. The method of claim 7, wherein the second stress-relief layer has a stress in a range from −1E+08 dyne/cm$^2$ to −2E+10 dyne/cm$^2$.

15. A semiconductor device, comprising:
- a substrate;
- a dielectric layer disposed on the substrate, wherein the dielectric layer comprises metal interconnects therein;
- a top metal layer disposed on the dielectric layer;
- a first stress-relief layer disposed on the top metal layer;
- a conductive pad disposed on the first stress-relief layer; and
- a second stress-relief layer disposed on the first stress-relief layer and the conductive pad, wherein the second stress-relief layer comprises a high compressive silicon nitride layer.

16. The semiconductor device of claim 15, wherein the first stress-relief layer is a HDPCVD oxide layer.

17. The semiconductor device of claim 15, wherein the bias RF of the first stress-relief layer is between 0-6500 W.

18. The semiconductor device of claim 15, wherein the conductive pad comprises aluminum.

19. The semiconductor device of claim 15, wherein the top metal layer comprises a patterned metal layer.

20. The semiconductor device of claim 15, wherein the second stress-relief layer has a stress in a range from −1E+08 dyne/cm$^2$ to −2E+10 dyne/cm$^2$.

\* \* \* \* \*